(12) United States Patent
Mankame et al.

(10) Patent No.: US 8,301,272 B2
(45) Date of Patent: Oct. 30, 2012

(54) ACTIVE MATERIALS-BASED COMPLIANT MECHANISMS

(75) Inventors: Nilesh D. Mankame, Ann Arbor, MI (US); Alan L. Browne, Grosse Pointe, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 883 days.

(21) Appl. No.: 12/327,316

(22) Filed: Dec. 3, 2008

(65) Prior Publication Data

US 2010/0138002 A1    Jun. 3, 2010

(51) Int. Cl.
  *G06F 19/00*    (2011.01)
(52) U.S. Cl. ............................................ 700/19; 73/649
(58) Field of Classification Search .............. 700/19–20; 318/618, 632, 560; 73/649, 862.01
  See application file for complete search history.

(56) References Cited

U.S. PATENT DOCUMENTS

| | | | | |
|---|---|---|---|---|
| 3,948,688 | A * | 4/1976 | Clark | 148/563 |
| 5,265,456 | A * | 11/1993 | Kennedy et al. | 72/342.7 |
| 5,649,454 | A * | 7/1997 | Midha et al. | 74/520 |
| 5,680,024 | A * | 10/1997 | Ehle et al. | 318/632 |
| 6,004,330 | A * | 12/1999 | Middleman et al. | 606/127 |
| 6,215,081 | B1 * | 4/2001 | Jensen et al. | 200/341 |
| 6,757,975 | B1 * | 7/2004 | Todd et al. | 29/893.33 |
| 7,115,092 | B2 * | 10/2006 | Park et al. | 600/143 |
| 7,874,223 | B2 * | 1/2011 | Sugar et al. | 74/110 |
| 7,901,524 | B1 * | 3/2011 | McKnight et al. | 148/563 |
| 2003/0011866 | A1 * | 1/2003 | Little et al. | 359/290 |
| 2003/0102411 | A1 * | 6/2003 | Kota | 244/219 |
| 2005/0206175 | A1 * | 9/2005 | Browne et al. | 292/253 |
| 2006/0097727 | A1 * | 5/2006 | Messenger et al. | 324/415 |
| 2006/0186126 | A1 | 8/2006 | Browne et al. | |
| 2006/0213305 | A1 * | 9/2006 | Sugar et al. | 74/490.01 |
| 2006/0254362 | A1 * | 11/2006 | Luharuka et al. | 73/649 |
| 2007/0079997 | A1 * | 4/2007 | Chan et al. | 180/7.1 |
| 2007/0089533 | A1 * | 4/2007 | Englund et al. | 73/862.01 |

OTHER PUBLICATIONS

Pederson et al., Design of a compliant Mechanism to Modify an Actuator Characteristic to Deliver a Constant Output Force, Sep. 2006, University of Combridge, vol. 128, pp. 1001-1111.*

Trease et al., Adaptive and controllable compliant systems with embedded actuators and sensors, The University of Michigan, Dep.of Mechanical Engineering, 2007, p. 1-13.*

Luzhong Yin and G.K. Ananthasuresh, Design of Distributed Compliant Mechanisms, Mechanics Based Design of Structures and Machines, 2003, pp. 151-179, vol. 31, No. 2, Marcel Dekker, Inc., New York.

Aaron M. Dollar and Robert D. Howe, Design and Evaluation of a Robust Compliant Grasper Using Shape Deposition Manufacturing, Proceedings of IMECE2005, 2005, ASME.

(Continued)

*Primary Examiner* — Kidest Bahta
(74) *Attorney, Agent, or Firm* — Quinn Law Group, PLLC (57) ABSTRACT

A compliant mechanism includes a body that is configured to generate a mechanical output in response to a mechanical input. The body has at least one region formed by an active material. The compliant mechanism also includes at least one activation device configured to selectively apply an activation signal to the at least one region. The active material is configured to undergo a change in modulus in response to the activation signal such that the output is characterized by a first magnitude or direction when the activation device applies the activation signal and a second magnitude or direction when the activation device does not apply the activation signal.

9 Claims, 4 Drawing Sheets

OTHER PUBLICATIONS

Regina M. Gouker, Design and Manufacturing of Compliant Mechanisms Using Multi-Material Molding, formerly available at ajcisr.eng.umd.edu/research/REU_reports/2004_PPTs/Gina%20Gouker%20paper.pdf, publication date unknown.

* cited by examiner

ACTIVE MATERIALS-BASED COMPLIANT MECHANISMS

TECHNICAL FIELD

This invention relates to compliant mechanisms that exhibit greater durability and/or adaptability post manufacture due to the ability to reversibly manipulate the properties of the active materials from which these mechanisms are made. This ability is used to reversibly modify the geometry, topology and/or the distribution of stiffness and damping in the mechanism, and thus, reversibly modify performance of the mechanism after it has been manufactured.

BACKGROUND OF THE INVENTION

Conventional or rigid body mechanisms comprise rigid links connected by kinematic joints (e.g. hinges, sliding joints, gears, etc.) to transfer motion and force. Unlike rigid body mechanisms, compliant mechanisms derive at least a part of their mobility from the deformation of flexible segments of the mechanism. Fully compliant mechanisms are typically single-piece elastic bodies that derive their mobility entirely from the deformation of the body of the mechanism. Many fully compliant mechanisms include de facto hinges, i.e., regions of the elastic bodies that act as hinges and hence, experience higher strain than surrounding regions. The higher strain in the de facto hinges is achieved in the prior art by having a relatively small cross sectional area in these regions as compared to the surrounding regions. De facto hinges store strain energy during the deformation of the mechanism and are the most common sites for material failure which limits the useful life of the mechanism. The ideas presented in this application also apply to the fully compliant part of a partially compliant mechanism. Hence, in the rest of the application, we will drop the qualifiers: partially or fully.

As used herein, "performance" refers to the force and/or motion transmission properties of a mechanism such as its quasi-static force-deflection behavior, the nature of its deformation, the path traced by a point on the mechanism, its dynamic response, etc. Once a compliant mechanism with a given design is fabricated, its performance in response to a given set of loads is fixed. Therefore, compliant mechanisms often must be custom-designed for each application.

SUMMARY OF THE INVENTION

A compliant mechanism includes a compliant mechanism body that is configured to generate a mechanical output in response to a mechanical input. The compliant mechanism body has at least one region formed by an active material. The active material is configured to undergo a change in at least one material property in response to an activation signal. Exemplary material properties include storage modulus, loss modulus, failure strain, etc. This change in property may be used to alter the performance of the mechanism while the activation signal is applied. Alternatively, the change in property may be used to alter the configuration of the mechanism such that the performance of the compliant mechanism is altered even when the activation signal is not applied. Both of the above approaches could be used in conjunction and/or synchronism.

The compliant mechanism provided herein is customizable for a variety of different applications because its configuration and hence its performance is adjustable. A corresponding method includes providing a compliant mechanism body having a first configuration such that the compliant mechanism body generates a first performance in response to an input. The compliant mechanism body has a region formed by an active material that is configured to undergo a change in configuration in response to an activation signal. The method further includes applying the activation signal to the region. This results in a change in the mechanism's performance in response to the same input.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

A compliant mechanism is made of a thermally-activated shape memory polymer (SMP). Temperature control elements (e.g. resistance heaters, thermo-electric modules, etc) that can locally heat and/or cool regions of the mechanism are distributed over the mechanism's body. The storage and loss moduli of SMPs undergo a significant decrease (e.g. by a factor or 10 to 1000) when heated above a characteristic forming temperature Tf (Tf>Tx, a characteristic switching temperature). Above Tf a specimen of the material exhibits rubbery behavior which is characterized by a low stiffness, low internal damping and high elastic strain limit. When the specimen is cooled below a characteristic setting temperature Ts (Ts<Tx), it recovers its glassy behavior which is characterized by a higher stiffness, higher internal damping and low elastic strain limit. The properties of the material (e.g. storage modulus, loss modulus, elastic strain limit, etc) vary continuously between Ts & Tf. The stiffness, internal damping and elastic strain limit of the regions of the mechanism in the proximity of the temperature control elements are thus selectively variable by controlling their temperature. When a small region of the mechanism is heated to a temperature above Tf, it can function as a de facto hinge depending on its location within the mechanism. When the region is subsequently cooled to below Ts, it reverts to being a stiff region in the mechanism. The impedance (stiffness & internal damping) of such a de facto hinge can be tuned to any value between the corresponding limits by controlling the temperature of the region between Ts & Tf. When a de facto hinge is created in this manner in a compliant mechanism whose body is made of a thermally activated SMP, the durability of the mechanism is improved as compared to the same mechanism with a de facto hinge created by reducing the cross-section locally, because the elastic limit strain is substantially (e.g. a factor of 1.5-20) higher in the former case.

If the properties of a larger region e.g. an entire segment of the mechanism body are modified by controlling its temperature, the larger segment can behave like a flexible link in the mechanism. When relative motion between parts of a compliant mechanism is enabled by flexing of an interposed flexible segment, the mechanism is said to exhibit distributed compliance. The lumped compliance associated with de facto hinges experiences higher strains and stresses because the relative motion between adjacent segments is achieved by the deformation of a very small region in the mechanism body. Distributing the compliance over a larger region leads to lower stresses and hence, a longer mechanism life. The ability to modulate the material properties allows designers to create both types of compliance as and when needed when at least a part of the compliant mechanism is made of active materials whose properties can be reversibly modulated by an appropriate stimulus.

Each temperature control element distributed over the mechanism body can create at least one controllable de facto hinge and/or flexible segment. The force and motion transmission characteristics of the compliant mechanism are selectively variable by controlling which, if any, of the de facto hinges and/or flexible segments are activated. The ability to create de facto hinges and/or flexible segments allows the user to modify the topology (i.e. the number of links, number of joints, type of links, type of joints, and the connectivity of links), and hence, the performance and/or functionality of the mechanism after it has been manufactured.

In the foregoing discussion, once a de facto hinge or a flexible segment was created by providing the appropriate stimulus at the proper level (e.g. heating the SMP above Tf), the stimulus was continuously applied to maintain the desired viscoelastic properties in the chosen regions as long as the mechanism was being used for its intended purpose. If a de facto hinge was created to enable the mechanism to perform a particular task, the material in that region was heated to Tf before the mechanism started the task and was kept above that temperature while the mechanism was performing the task.

When the stimulus applied to create a de facto hinge or a flexible segment is removed (e.g. if the de facto hinge/flexible segment region in the compliant mechanism made of thermally activated SMP is cooled to below Ts), the hinge or flexible segment reverts back to being a rigid element. When cooled below Ts, the de facto hinge/flexible segment is 'locked-in' or 'frozen' in the last shape created by the forces acting on it before cooling to below Ts. This 'frozen' state is temporary and is retained as long as the temperature stays below Ts and the stress at the hinge/segment due to the applied loads stays below a threshold value. At higher stresses, the material in the hinge/segment may undergo recoverable or unrecoverable (e.g., plastic) strain that results in a deviation from the 'frozen' configuration. The original configuration can be easily recovered by heating the mechanism to a temperature above Tf while there are no external loads acting on it and it has not undergone any unrecoverable strain.

De-activating a de facto hinge or a flexible segment reduces the mobility of the compliant mechanism, thereby limiting its functionality. If enough de facto hinges and/or flexible segments, created as described earlier, are de-activated the mobility of the mechanism can be reduced to zero—essentially locking the mechanism in its last configuration. The ability to lock a mechanism (rigid body or compliant) in a configuration without supplying any energy for maintaining that configuration is very useful and is often referred to as zero-power hold or a power-off hold. Note that in a compliant mechanism, like in all mechanisms, mobility is determined on a nominal input and output force and/or motion; excessive input and/or output forces may produce undesirable mobility and result in damage to the mechanism. We assume nominal operation in the foregoing description of the zero-power hold capability in a compliant mechanism.

In the above discussion the application of suitable stimuli to produce a desired spatial variation in the stiffness and internal damping characteristics of the mechanism were disclosed. A straightforward extension of this concept involves temporal variations in these properties by controlling the magnitude and/or phase of the stimuli applied to different parts of the mechanism as a function of time. The spatial and temporal variation of the mechanical properties may also be done concurrently. The modulation of the stimuli may be done as a part of open-loop control of the mechanism, or it may be used for closed-loop control of the mechanism.

The ability to lock-in temporary deformations can be used to change the performance of the mechanism without requiring the stimuli to be applied continuously while the mechanism is in use. In this case the stimulus is applied to one or more segments of a compliant mechanism body before it is used. The localized or distributed compliance created by the application of the stimulus is used in conjunction with an external force to modify the geometry of these segments. As used herein, "geometry" includes lengths, shapes and cross-sectional dimensions of mechanism segments and positions of salient points in the mechanism.

These changes are then locked-in to ensure that the modified geometry is retained even when the stimulus is OFF. The change in the geometry results in a change of the kinematic and/or kinetostatic parameters of the mechanism and hence, a change in its quasi-static and/or dynamic performance. As discussed earlier, the original configuration can be easily recovered by heating the mechanism to a temperature above Tf while there are no external loads acting on it.

Figure 1:
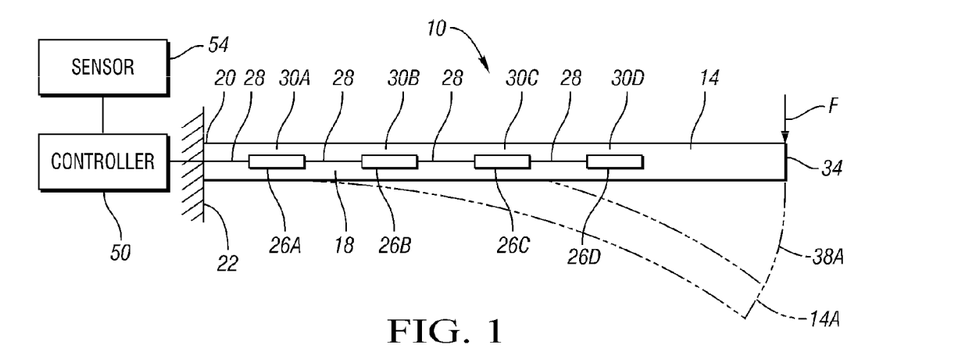
FIG. 1 is a schematic, cross-sectional, side view of a compliant mechanism having four activation devices.

Referring to FIG. 1, a portion of a compliant mechanism 10 is schematically depicted. The compliant mechanism 10 includes an elastic body 14 comprising an active material 18. The active material 18 is characterized by material properties that can be modified by the application of an appropriate stimulus. Exemplary material properties include elastic properties such as modulus, elastic strain rate, etc as well as the internal damping in the material. The active material 18 is configured to undergo a change in at least one of the material properties in response to an activation signal. More specifically, the material property is characterized by a measurable value that varies in response to the application of the activation signal (stimulus).

One end 20 of the elastic body 14 is mounted to a stationary object 22 in a cantilever fashion. In an unstressed state, as shown at 14 in FIGS. 1-3, the elastic body 14 is generally linear, and is characterized by a constant cross-sectional area along its length. It should be noted that, although the elastic body 14 in the embodiment depicted is linear in an unstressed state and characterized by a constant cross section area, the elastic body 14 of a compliant mechanism may be characterized by any shape within the scope of the claimed invention. In the embodiment depicted, the active material 18 extends the entire length of the elastic body 14.

The compliant mechanism 10 also includes a plurality of activation devices 26A-26D spaced apart from one another along the length of the elastic body 14. Each activation device 26A-26D is configured to selectively apply the activation signal to a respective region 30A-30D of the elastic body 14 such that at least one material property is altered in each of the regions 30A-30D. Thus, each activation device 26A-26D is operative to selectively vary the elastic properties of a respective one of the regions 30A-30D. In one embodiment, the active material 18 is a thermally-activated shape memory polymer (SMP), and the activation devices 26A-26D are electrical resistance heating elements configured to apply heat, i.e., a thermal activation signal, to a respective one of the regions 30A-30D.

Generally, SMPs are phase segregated co-polymers comprising at least two different units, which may be described as defining different segments within the SMP, each segment contributing differently to the overall properties of the SMP. As used herein, the term "segment" refers to a block, graft, or sequence of the same or similar monomer or oligomer units, which are copolymerized to form the SMP. Each segment may be crystalline or amorphous and will have a corresponding melting point or glass transition temperature (Tg), respectively. The terms "characteristic switching temperature" or "thermal transition temperature" are used interchangeably herein for convenience to generically refer to either a Tg or a melting point depending on whether the segment is an amorphous segment or a crystalline segment. For SMPs comprising (n) segments, the SMP is said to have a hard segment and (n−1) soft segments, wherein the hard segment has a higher thermal transition temperature than any soft segment. Thus, the SMP has (n) thermal transition temperatures. The thermal transition temperature of the hard segment is termed the "last transition temperature," and the lowest thermal transition temperature of the so-called "softest" segment is termed the "first transition temperature." It is important to note that if the SMP has multiple segments characterized by the same thermal transition temperature, which is also the last transition temperature, then the SMP is said to have multiple hard segments.

When the SMP is heated above the last transition temperature, the SMP material can be shaped. A permanent shape for the SMP can be set or memorized by subsequently cooling the SMP below that temperature. As used herein, the terms "original shape," "previously defined shape," and "permanent shape" are synonymous and are intended to be used interchangeably. A temporary shape can be set by heating the material to a temperature higher than a thermal transition temperature of any soft segment yet below the last transition temperature, applying an external stress or load to deform the SMP, and then cooling below the particular thermal transition temperature of the soft segment while maintaining the deformation.

The permanent shape can be recovered by heating the material, with the stress or load removed, above the particular thermal transition temperature of the soft segment yet below the last transition temperature. Thus, it should be clear that by combining multiple soft segments it is possible to demonstrate multiple temporary shapes and with multiple hard segments it may be possible to demonstrate multiple permanent shapes. Similarly using a layered or composite approach, a combination of multiple SMPs will demonstrate transitions between multiple temporary and permanent shapes.

For SMPs with only two segments, the temporary shape of the shape memory polymer is set at the first transition temperature, followed by cooling of the SMP, while under load, to lock in the temporary shape. The temporary shape is maintained as long as the SMP remains below the first transition temperature. The permanent shape is regained when the SMP is once again brought above the first transition temperature. Repeating the heating, shaping, and cooling steps can repeatedly reset the temporary shape.

Most SMPs exhibit a "one-way" effect, wherein the SMP exhibits one permanent shape. Upon heating the shape memory polymer above a soft segment thermal transition temperature without a stress or load, the permanent shape is achieved and the shape will not revert back to the temporary shape without the use of outside forces.

As an alternative, some shape memory polymer compositions can be prepared to exhibit a "two-way" effect, wherein the SMP exhibits two permanent shapes. These systems include at least two polymer components. For example, one component could be a first cross-linked polymer while the other component is a different cross-linked polymer. The components are combined by layer techniques, or are interpenetrating networks, wherein the two polymer components are cross-linked but not to each other. By changing the temperature, the shape memory polymer changes its shape in the direction of a first permanent shape or a second permanent shape. Each of the permanent shapes belongs to one component of the SMP. The temperature dependence of the overall shape is caused by the fact that the mechanical properties of one component ("component A") are almost independent from the temperature in the temperature interval of interest. The mechanical properties of the other component ("component B") are temperature dependent in the temperature interval of interest. In one embodiment, component B becomes stronger at low temperatures compared to component A, while component A is stronger at high temperatures and determines the actual shape. A two-way memory device can be prepared by setting the permanent shape of component A ("first permanent shape"), deforming the device into the permanent shape of component B ("second permanent shape"), and fixing the permanent shape of component B while applying a stress.

It should be recognized by one of ordinary skill in the art that it is possible to configure SMPs in many different forms and shapes. Engineering the composition and structure of the polymer itself can allow for the choice of a particular temperature for a desired application. For example, depending on the particular application, the last transition temperature may be about 0° C. to about 300° C. or above. A temperature for shape recovery (i.e., a soft segment thermal transition temperature) may be greater than or equal to about −30° C. Another temperature for shape recovery may be greater than or equal to about 20° C. Another temperature for shape recovery may be greater than or equal to about 70° C. Another temperature for shape recovery may be less than or equal to about 250° C. Yet another temperature for shape recovery may be less than or equal to about 200° C. Finally, another temperature for shape recovery may be less than or equal to about 180° C.

Suitable polymers for use in the SMP include thermoplastics, thermosets, interpenetrating networks, semi-interpenetrating networks, or mixed networks of polymers. The polymers can be a single polymer or a blend of polymers. The polymers can be linear or branched thermoplastic elastomers with side chains or dendritic structural elements. Suitable polymer components to form a shape memory polymer include, but are not limited to, polyphosphazenes, poly(vinyl alcohols), polyamides, polyester amides, poly(amino acid)s, polyanhydrides, polycarbonates, polyacrylates, polyalkylenes, polyacrylamides, polyalkylene glycols, polyalkylene oxides, polyalkylene terephthalates, polyortho esters, polyvinyl ethers, polyvinyl esters, polyvinyl halides, polyesters, polylactides, polyglycolides, polysiloxanes, polyurethanes, polyethers, polyether amides, polyether esters, polystyrene, polypropylene, polyvinyl phenol, polyvinylpyrrolidone, chlorinated polybutylene, poly(octadecyl vinyl ether) ethylene vinyl acetate, polyethylene, poly(ethylene oxide)-poly(ethylene terephthalate), polyethylene/nylon (graft copolymer), polycaprolactones-polyamide (block copolymer), poly(caprolactone) dimethacrylate-n-butyl acrylate, poly(norbornyl-polyhedral oligomeric silsesquioxane), polyvinyl chloride, urethane/butadiene copolymers, polyurethane block copolymers, styrene-butadiene-styrene block copolymers, and the like, and combinations comprising at least one of the foregoing polymer components. Examples of suitable polyacrylates include poly(methyl methacrylate), poly(ethyl methacrylate), ply(butyl methacrylate), poly(isobutyl methacrylate), poly(hexyl methacrylate), poly(isodecyl methacrylate), poly(lauryl methacrylate), poly(phenyl methacrylate), poly(methyl acrylate), poly(isopropyl acrylate), poly(isobutyl acrylate) and poly(octadecyl acrylate). The polymer(s) used to form the various segments in the SMPs described above are either commercially available or can be synthesized using routine chemistry. Those of skill in the art can readily prepare the polymers using known chemistry and processing techniques without undue experimentation.

Thermally-activated shape memory polymers exhibit a significant decrease in modulus when heated above the thermal transition temperature ($T_x$). More specifically, the storage and the loss moduli of an SMP are strongly dependent on the temperature (especially near the thermal transition temperature). Thus, thermally-activated shape memory polymers respond to a thermal activation signal, by exhibiting a significant decrease in modulus when their temperature is raised above Tx. Each of the activation devices 26A-26D is configured to selectively apply a thermal activation signal to a respective one of the regions 30A-30D when activated, thereby to heat the respective one of the regions above the thermal transition temperature.

Thus, when the activation signal is applied to a particular region 30A-30D, the modulus of the region is significantly reduced and the region becomes a lower stiffness portion of the elastic body 14, and thus functions as a de facto hinge as long as the activation signal is applied. In the absence of the activation signal, i.e., below the thermal transition temperature, a region 30A-30D is not a lower stiffness portion of the elastic body 14, and does not function as a de facto hinge. Accordingly, regions 30A-30D are selectively activatable de facto hinges.

In the embodiment depicted, the activation devices 26A-26D are embedded within the active material 18 to be an integrated portion of the elastic body 14. Other activation device configurations may be employed within the scope of the claimed invention. For example, activation devices 26A-26D may be mounted externally to the elastic body 14. Conductive wires 28 are also embedded within the elastic body 14 to selectively supply electrical current to the activation devices 26A-26D from an electrical energy source (not shown). The activation devices 26A-26D are wired such that any device 26A-26D can be individually selected.

In FIG. 1, none of the activation devices 26A-26D are applying the activation signal to regions 30A-30D, and therefore the stiffness of regions 30A-30D is not locally reduced; that is, regions 30A-30D have substantially the same elastic properties as the rest of the elastic body 14. When an input force F is applied to the end 34 of the elastic body 14 that is opposite end 20, the elastic body 14 is deflected to the position shown at 14A. In response to the input force F, the compliant mechanism is characterized by an output motion: the end 34 follows a path 38A as the elastic body 14 is deflected to the position shown at 14A. When the load F is removed, the elastic body returns to the position shown at 14 due to the release of elastic energy stored in the elastic body 14. The dimensions of the compliant mechanism 10 and the elastic properties of the SMP are chosen to ensure that the compliant mechanism 10 has sufficient stiffness (e.g. to transmit/resist the desired loads) at the desired operating temperature of the mechanism 10 when the desired de-facto hinges 30A-30D are activated.

Figure 2:
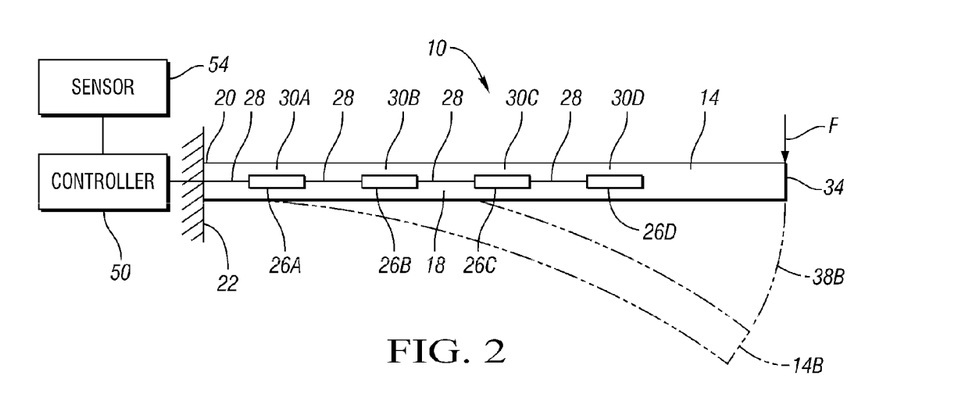
FIG. 2 is a schematic, cross-sectional, side view of the compliant mechanism of FIG. 1 with a first of the activation devices applying an activation signal to a first region of the compliant mechanism.

Referring to FIG. 2, wherein like reference numbers refer to like components from FIG. 1, activation device 26A is applying the activation signal to region 30A such that region 30A is a locally weakened portion of the elastic body 14. That is, activation device 26A is applying thermal energy to region 30A such that region 30A is above the thermal transition temperature. Activation devices 26B-26D are not applying the activation signal to regions 30B-30D, and regions 30B-30D are below the thermal transition temperature. When input force F is applied to end 34, activated region 30A acts as a flexure hinge, and the elastic body 14 deforms to the position shown at 14B. In response to the input force F, the compliant mechanism is characterized by an output motion: the end 34 follows a path 38B as the elastic body 14 is deflected to the position shown at 14B. Less strain energy stored in the region 30A as the deformation of the elastic body 14 takes place in this case because region 30A is above the thermal transition temperature than if the same deformation occurred while the region 30A was below the thermal transition temperature. Hence, the elastic body 14 may show a lesser tendency to spring back to its initial configuration if the applied force F is removed while region 30A is above the thermal transition temperature.

If the region 30A is allowed to cool to below the thermal transition temperature, i.e., by deactivating the activation device 26A, while force F is maintained, then the elastic body 14 will maintain the deflected shape shown at 14B even after the removal of force F. At a later time, if activation device 26A applies the activation signal to region 30A to heat region 30A above the transition temperature, then the locked-in strain at region 30A is releasable.

Figure 3:
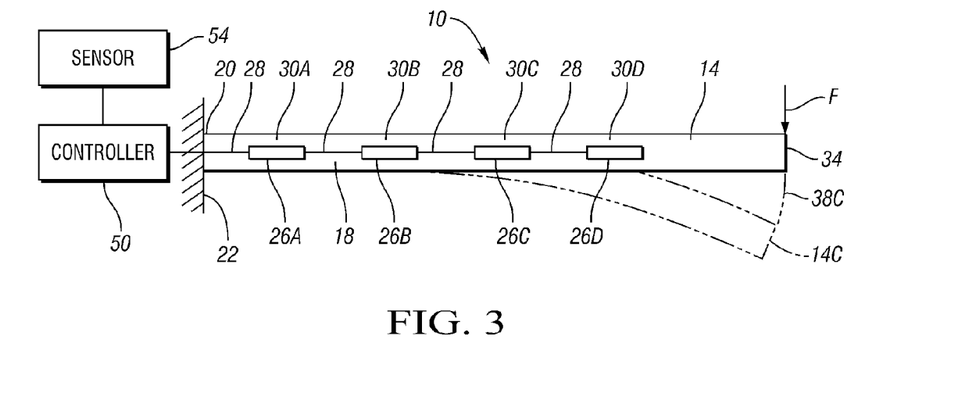
FIG. 3 is a schematic, cross-sectional, side view of the compliant mechanism of FIGS. 1 and 2 with a second of the activation devices applying an activation signal to a second region of the compliant mechanism.

Referring to FIG. 3, wherein like reference numbers refer to like components from FIGS. 1 and 2, activation device 26B is applying the activation signal to region 30B such that region 30B is a locally weakened portion of the elastic body 14. Activation devices 26A, 26C, 26D are not applying the activation signal to regions 30A, 30C, 30D, and thus regions 30A, 30C, 30D are not locally weakened portions of the elastic body 14. When force F is applied to end 34, activated region 30B acts as a flexure hinge, and the elastic body 14 deforms to the position shown at 14C. In response to the input force F, the compliant mechanism is characterized by an output motion: the end 34 follows a path 38C as the elastic body 14 is deflected to the position shown at 14C.

If the region 30B is allowed to cool to below the thermal transition temperature, i.e., by deactivating the activation device 26B, while force F is maintained, then the elastic body 14 will maintain the deflected shape shown at 14C even after the removal of force F. At a later time, if activation device 26B applies the activation signal to region 30B to heat region 30B above the transition temperature, then the locked-in strain at region 30B is releasable.

Referring to FIGS. 1-3, the paths 38A-C followed by the end 34 of the elastic body 14 in response to input force F varies depending upon which, if any, of the regions 30A-D is above the thermal transition temperature; thus, the force-deflection characteristics of the elastic body 14 are selectively variable by activating the activation devices 26A-D. More specifically, in the embodiment depicted, paths 38A-C are arcs having radii different from one another. The linear elastic body 14 may assume a wide variety of shapes by simultaneously or sequentially activating multiple activation devices 26A-D and applying appropriate loads to the elastic body 14.

The activation signal is characterized by a property having a measurable value that is selectively variable. For example, if the activation signal is thermal, then the measurable value may be temperature. Exemplary properties of the activation signal may include amplitude, phase, etc. The active material 18 is configured such that the value of the material property is a function of the value of the property of the activation signal; that is, across as least a range of the values of the property of the activation signal, a change in the value of the property of the activation signal causes a change in the value of the material property. The activation devices 26A-D are configured such that the activation signal value is selectively variable. In the embodiment in which activation devices 26A-D are electrical resisitance heaters, the temperature of the devices 26A-D is controllable by controlling the amount of electrical current to the devices 26A-D.

Referring specifically to FIG. 1, the compliant mechanism 10 includes a controller 50. The controller 50 is operatively connected to each of the activation devices 26A-D via wires 28, and is configured to selectively control the value of the material property of active material 18 in regions 30A-D. More specifically, the value of the material property in one of the regions 30A-D is determined by the temperature of the region; the temperature of the region is determined, at least in part, by the amount of electric current received by the activation device associated with the region. The controller 50 is configured to control the amount of electrical current through the wires 28 to the activation devices 26A-D. Accordingly, the controller 50 is configured to control the temperature of the regions 30A-D by controlling the electrical current transmitted to the activation devices 26A-D.

The controller 50 is configured to control each of the activation devices 26A-D individually. In other words, the amount of electrical current transmitted to any one of the activation devices 26A-D is independent of the amount of current transmitted to any of the other activation devices 26A-D.

In the embodiment in which the active material 18 is SMP, the storage and loss moduli of the SMP are strongly dependent upon temperature, especially near the transition temperature Tx. As previously noted, the properties of the material (e.g. storage modulus, loss modulus, elastic strain limit, etc) vary continuously between Ts & Tf. Thus, the controller 50 is configured to selectively control the storage and loss moduli of regions 30A-D by controlling the amount of current to the activation devices 26A-D. This ability to vary the temperature of an activation device 26A-D allows control over the compliance and damping capacity of the region 30A-D corresponding to the activation device 26A-D. By selectively choosing which of the activation devices 26A-D to activate, and to what temperature to raise the corresponding regions 30A-D, the controller 50 controls the distribution of stiffness as well as damping in the compliant mechanism body 14.

The temperature of regions intended to be pure flexible segments needs to be maintained at or above a forming temperature, that of regions intended to be damped flexible segments to be maintained between a setting and a forming temperature, and that of rigid segments to be maintained below a forming temperature. The activation devices may also be repositioned to change their regions of influence independent of their activation/de-activation state. It should be noted that activation devices may also include coolers configured to lower the temperatures of regions.

The compliant mechanism 10 also includes at least one sensor 54 operatively connected to the controller 50. The sensor 54 is configured to monitor a condition, and to transmit a sensor signal to the controller 50 that is indicative of the condition. Exemplary conditions include temperatures of one or more regions of the body, the displacement of a first part of the body 14 with respect to a second part of the body 14, the magnitude and vector of an input force F, etc.

The controller 50 is programmed to determine and control the amount of electric current to each of the activation devices 26A-D, and therefore the values of the material properties of regions 30A-D, based on the sensor signals from sensor 54 and according to a predetermined algorithm to achieve a predetermined mechanical output of the compliant mechanism 10 for a given input F. For example, depending upon the input and the sensor signals, the controller 50 may activate only activation device 26A, the controller 50 may activate only two of the activation devices 26A-D, or the controller may activate all of the activation devices 26A-D. Similarly, depending on the sensor signals, the controller may cause region 30A to heat to a first temperature, region 30D to heat to a second temperature different from the first temperature, and the controller may not activate the activation devices 26B and 26C so that regions 30B and 30D are not heated.

Depending on the sensor signals, the controller 50 may also vary the temperatures of the various regions with respect to time while the input force is applied. Thus, the locations of flexible segments, stiffness of flexible and rigid segments, and damping coefficients for flexible segments can all be changed in real time in response to the controller 50 that senses the mechanism's actual response. Similarly, and within the scope of the claimed invention, the length of flexible segments may be varied by the selective application of the activation signal.

Figure 4:
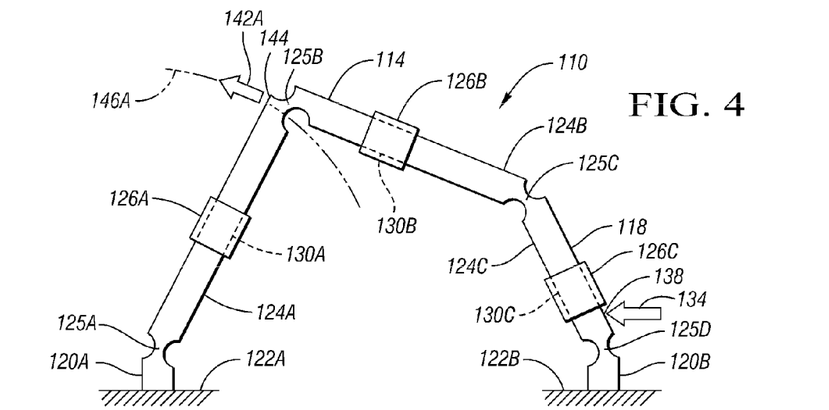
FIG. 4 is a schematic side view of another compliant mechanism characterized by a first configuration and having a plurality of activation devices.

Referring to FIG. 4, a compliant mechanism 110 includes an elastic body 114. The elastic body 114 comprises active material 118. One end 120A of the elastic body 114 is mounted to a first anchor 122A, and another end 120B of the elastic body 114 is mounted to a second anchor 122B. Anchors 122A, 122B are spatially fixed relative to one another.

The elastic body 114 is characterized by three linear segments 124A-C. The elastic body 114 is also characterized by four de facto hinges 125A-D. Each of the de facto hinges 125A-D in the embodiment depicted is formed by a region of the elastic body 114 characterized by a locally reduced cross-sectional area, as understood by those skilled in the art. The smaller cross sectional area of the de facto hinges 125A-D compared to the remainder of the elastic body 114 results in locally concentrated strain. The de facto hinges 125A-D are preferably characterized by fillets, as shown, to improve durability. De facto hinge 125A separates end 120A from segment 124A. De facto hinge 125B separates segment 124A and segment 124B. De facto hinge 125C separates segment 124B and segment 124C. De facto hinge 125D separates segment 124C and end 120B.

The compliant mechanism 110 further includes three activation devices 126A-C. Each activation device 126A-C is configured to selectively apply the activation signal to a respective region 130A-130C of the elastic body 114 such that the region 130A-C alters at least one material property. Thus, each activation device 126A-C is operative to selectively vary the specified material properties of a respective one of the regions 130A-C.

In one embodiment, the active material 118 is a shape memory polymer (SMP), and each of the activation devices 126A-C is an electrical resistance heating element configured to selectively apply heat, i.e., a thermal activation signal, to a respective one of the regions 130A-C, thereby to selectively raise the respective one of the regions 130A-C above the thermal transition temperature. In the embodiment depicted, each activation device 126A-C is a flexible sleeve that surrounds a respective region 130A-C. Region 130A is part of segment 124A; region 130B is part of segment 124B; and region 130C is part of segment 124C.

The compliant mechanism 110 is characterized by a first configuration in FIG. 4. The activation devices 126A-126C are deactivated so that the regions 130A-C are not locally weakened and have the same modulus and cross sectional area as the remainders of segments 124A-C. The compliant mechanism, in the first configuration, is designed such that, in response to an input force 134 exerted at input port 138 on the compliant mechanism 110, the compliant mechanism 110 generates an output force 142A at output port 144. The compliant mechanism 110 also generates an output motion in response to the input force 134: output port 144 moves along path 146A. The output force 142A and output motion occur without activation of any of the activation devices 126A-C, i.e., in the absence of the activation signal being applied to regions 130A-C.

Figure 5:
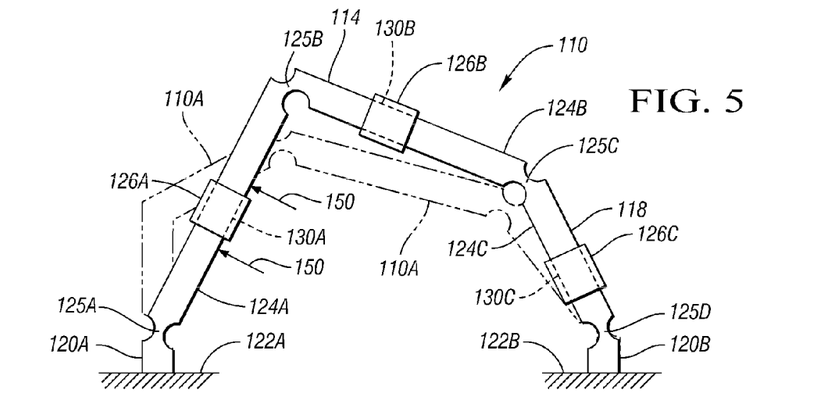
FIG. 5 is a schematic side view of the compliant mechanism of FIG. 4 with one of the activation devices applying an activation signal to a region of the compliant mechanism, and the configuration of the mechanism being changed by the application of an external force while the activation signal is applied.

The output of the compliant mechanism 110 may be changed by changing the shape or configuration of the compliant mechanism 110. Thus, for example, if a second output is desired for input 134 in the absence of activation signals to regions 130A-C, then the compliant mechanism 110 may be reshaped in a manner to achieve the second output. Referring to FIG. 5, wherein like reference numbers refer to like components from FIG. 4, activation device 126A is activated to apply a thermal activation signal to region 130A. Region 130A is thus heated above the thermal transition temperature and is a locally weakened portion of segment 124A. By applying shaping forces 150 to the compliant mechanism 110 while the region 130A is above the thermal transition temperature, region 130A of segment 124A is deformed such that the compliant mechanism adopts a second configuration shown in phantom at 110A. After the compliant mechanism is in the shape shown at 110A, the activation device 126A is deactivated, i.e., the region 130A is allowed to cool to below the thermal transition temperature. The shaping forces 150 are maintained until the region 130A is below the thermal transition temperature so that the compliant mechanism retains the shape shown at 110A.

Figure 6:
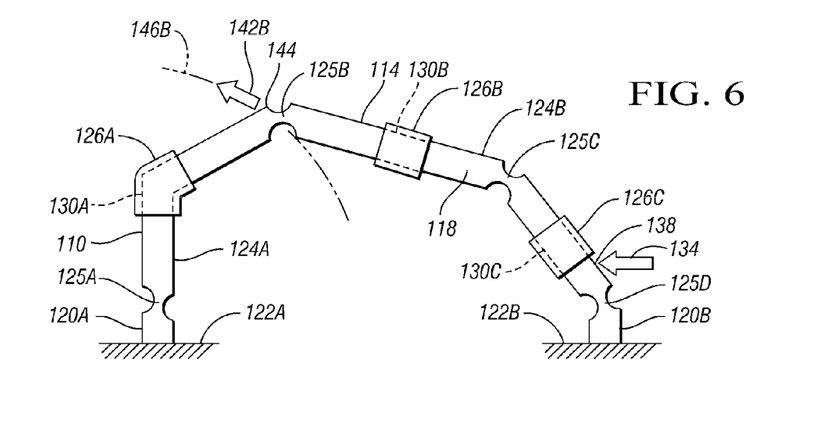
FIG. 6 is a schematic side view of the compliant mechanism of FIGS. 4 and 5 characterized by a second configuration different from the first configuration.

Referring to FIG. 6, wherein like reference numbers refer to like components from FIGS. 4 and 5, the compliant mechanism 110 is characterized by the second configuration, and all of the activation devices 126A-C are off. With the second shape or configuration, the compliant mechanism 110 is configured to generate output force 142B at output port 144 in response to input the force 134 at input port 138. Output force 142B is different from the output force 142A in magnitude and direction. The compliant mechanism 110 also generates an output motion: output port 144 moves along path 146B in response to input force 134. Path 146B is different from path 146A; more specifically, paths 146A and 146B are arcs of circles having differing radii. The direction of initial motion of output port 144 when the compliant mechanism is in the first configuration is different from the direction of initial motion when the compliant mechanism is in the second configuration. The force-deflection characteristics of the compliant mechanism 110 are different in the first and second configurations due to a change in the effective length in segment 124A and a change in the initial inclinations of links 124B, 124C.

Activation devices 126B, 126C are similarly activatable to deform regions 130B, 130C, respectively, and further reshape the compliant mechanism. The output force and motion generated by the compliant mechanism in response to the input force may also be selectively variable by activating one or more of the activation devices 126A-C such that one or more of the regions 130A-C is above the thermal transition temperature of the SMP and acts as a de facto hinge. Unlike the previous case where a change in the mechanism performance was effected by a change in the geometry of the mechanism, here the change in performance is effected by a change in the topology of the mechanism.

In an alternative embodiment, active material actuators (not shown) are embedded in the body 114 of the compliant mechanism 110, and are configured to change the configuration, and hence the performance, of the mechanism in response to an activation signal. The change of shape of the active material actuators causes the body 114 to change shape, and thus the change of shape of the active material actuator alters the performance of the compliant mechanism 110. In an exemplary embodiment, the active material actuators are pre-strained thermally activated shape memory alloy (SMA) actuator elements, which are in the partially de-twinned martensitic phase (m-phase), are embedded in the body 114 of the compliant mechanism 110 in its original (or as manufactured) configuration (as shown in FIG. 4). One or more of these SMA actuator elements may be activated (e.g. via Joule heating) in conjunction to deform the body 114 of the compliant mechanism 110 such that it attains an altered configuration, such as the one shown in phantom at 110A in FIG. 5 and at 110 in FIG. 6. Further, this deformation may be locked-in by coordinating the activation of the SMA actuator elements with the change in the properties of the active material 118 of the body 114 by activation devices 126A-C as described earlier. As a different initial configuration is obtained for each distinct set of SMA actuator elements activated, considerable flexibility of end-use of the compliant mechanism is obtained by this approach.

De-activation of the actuated SMA actuator elements allows the strain energy stored in the compliant mechanism when it was deformed to restore the mechanism to its initial configuration. If the change in initial configuration was done in conjunction with a change in material properties for the body 114 of the compliant mechanism, those changes would also need to be reversed in synchronism with de-activation of the SMA actuator elements to revert the mechanism 110 back to its initial configuration. Antagonistic SMA actuation may also be used to transition the mechanism between its initial configuration and an altered configuration.

Referring to FIGS. 1 and 4, it should be noted that the compliant mechanisms 10, 110 may include an elastic spring (not shown) configured to assist the compliant mechanism in returning to a predefined shape. In an exemplary embodiment, the elastic spring is embedded within the compliant mechanism.

A variety of active materials 18, 118 may be used within the scope of the claimed invention. In another exemplary embodiment, active materials 18, 118 are magnetorheological (MR) elastomers, and activation devices 26A-26D, 126A-126C are configured to selectively apply a magnetic field to a respective one of regions 30A-30D, 130A-130C, respectively. The strength of the magnetic field is controllable over a range of strengths to control the modulus or other elastic properties over a range of values. Since the stiffness of an MR elastomer increases with the strength of the magnetic field, it may be desirable to employ a permanent magnet biasing field (not shown) on the compliant mechanism 10, 110 such that the active material 18, 118 is stiff in the absence of magnetic activation signals from activation devices 26A-26D, 126A-126C. Magnetic fields from activation devices 26A-26D, 126A-126C would then lower the stiffness of regions 30A-30D, 130A-130C by locally cancelling the permanent magnet biasing field.

In the embodiments depicted, the compliant mechanism bodies 14, 114 are formed of a single piece of active material 18, 118. However, it should be noted that, within the scope of the claimed invention, a compliant mechanism may include, for example, non-active segments interconnected by active material regions.

In yet another exemplary embodiment, a compliant mechanism is made of thermally activated SMA, which is in its austenitic phase at the normal operating temperatures. The de-facto hinges are of a geometry such that the stress in the hinges is much higher than that in the rest of the mechanism. Specifically, the geometry is chosen such that the stress required to induce martensite is readily exceeded when the mechanism is loaded. This leads to a very low stiffness in the hinge, allowing large relative motion to occur at the hinge; the relative motion can be large because the stress-induced austenite to martensite transformation has a recoverable strain limit of 8%. Unloading the mechanism causes the stress-induced martensite to revert back to austenite, thereby restoring the original characteristics of the mechanism.

A significant change in mechanical properties such as the storage and loss moduli can also be induced in some materials by the application of stress above a characteristic threshold (Sf). All materials will experience a significant change in these moduli at stresses exceeding the failure stress level (Sx corresponding to yield, fracture, etc); however, some materials (e.g. shape memory alloys in their partially de-twinned martensitic as well as fully austenitic states, shape memory polymers, baroplastics, etc) can undergo large strains at a significantly lower modulus above a threshold stress S but below a failure stress (Sf<=S<Sx) such that these strains can be wholly recovered. Recovery of the stress may need the application of an external stimulus (e.g. heat in the case of shape memory polymers and partially de-twinned martensitic SMAs) or simply a reduction in the applied stress to a level below Sf (e.g. S<=Sf<Sx in fully austenitic SMAs).

Figure 7:
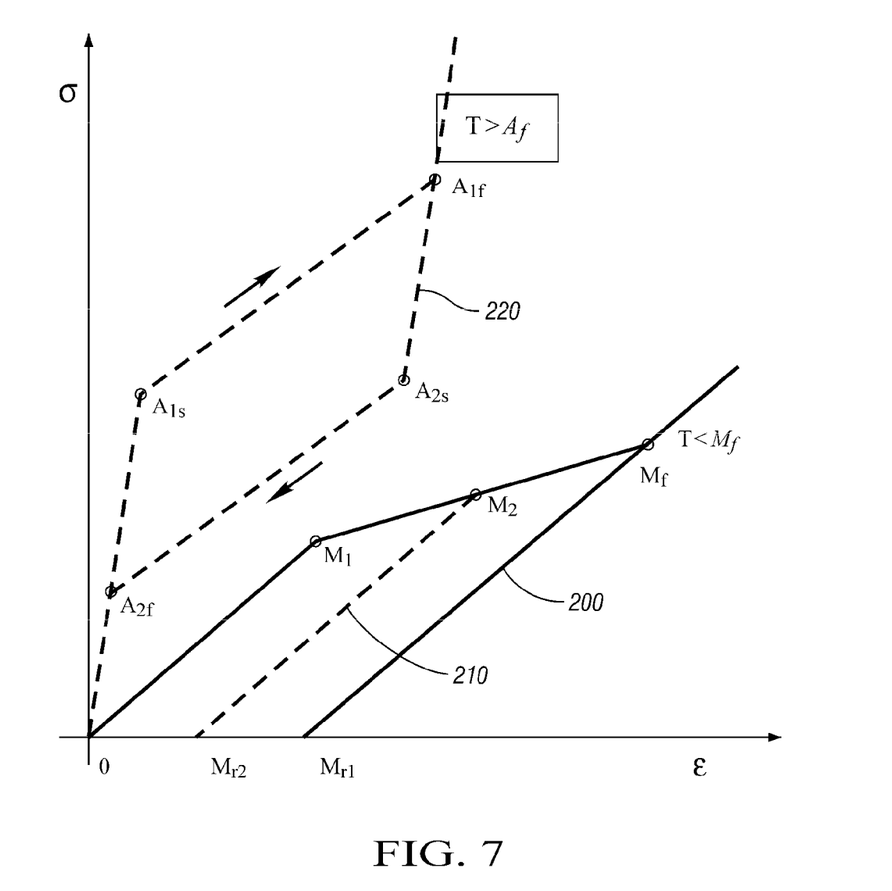
FIG. 7 is a graph depicting an idealized response for shape memory alloy in its martensitic and austenitic states.

FIG. 7 depicts an idealized response for SMA in its martensitic and austenitic states. Line 200 depicts fully de-twinned martensitic state, line 210 depicts partially de-twinned martensitic state, and line 220 depicts austenitic state. Consider a compliant mechanism made of a fully austenitic SMA. As the mechanism is loaded and the stress in a region (which will become a de-facto hinge/flexible segment as the loading continues) increases from O. When the stress rises above the stress-induced austenite→martensite conversion stress level at $A_{1s}$ the stiffness undergoes a considerable reduction and the region can undergo local strain up to 8% till the stress reaches the level $A_{1f}$. When the region is unloaded, the stress needs to drop below $A_{2s}$ for the region to experience another regime of low stiffness as the material undergoes a reverse (stress-induced martensite→austenite) transformation. The transformation is completed at $A_{2f}$. Between the above characteristic stress levels, which depend on the material composition and its temperature, the region can function as a de-facto hinge.

In case of a compliant mechanism made of SMA in its partially de-twinned martensitic state, as the stress increases from 0 (at $M_{r2}$) to $M_2$ the material exhibits a certain stiffness. When the stress exceeds $M_2$, the stiffness of the material reduces significantly as the material undergoes stress-induced de-twinning. This stops at $M_f$. A region of the compliant mechanism that experiences a stress between M2 and Mf can function as a de facto hinge. On unloading to zero stress at $M_{r1}$, the material stiffness remains at its high value. A thermal recovery step in which it is heated above the Af temperature and then cooled under zero (or the specified system starting) load allows it to recover its initial configuration and stiffness at $M_{r2}$. The characteristic stress levels are again influenced by temperature and the material composition. A similar situation holds for a mechanism whose body is made of an SMA in its fully de-twinned state in the initial configuration of the mechanism.

Figure 8A:
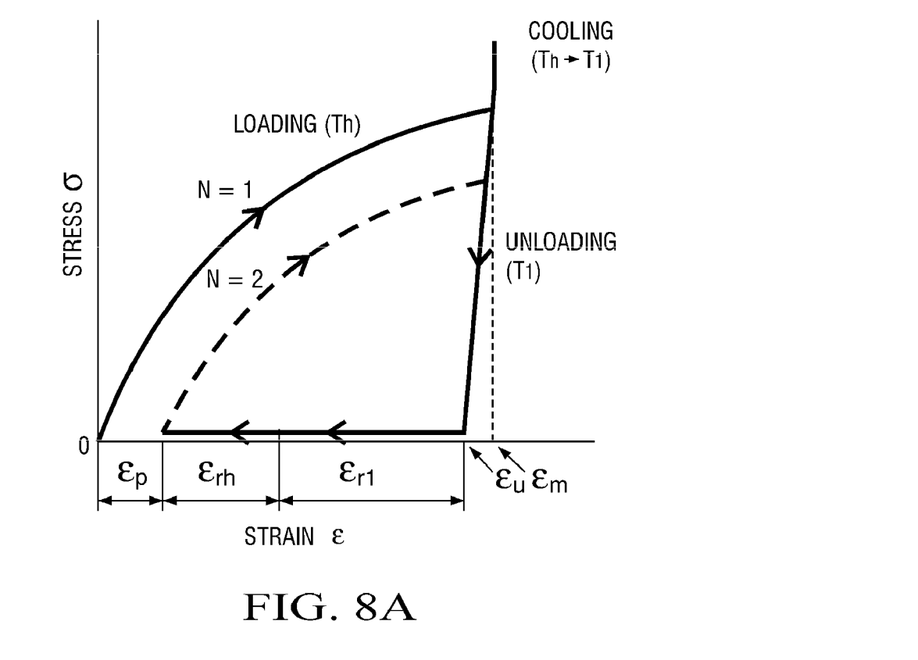
FIG. 8A is a graph depicting the relationship between stress and strain in shape memory polymer above a characteristic forming temperature.
Figure 8B:
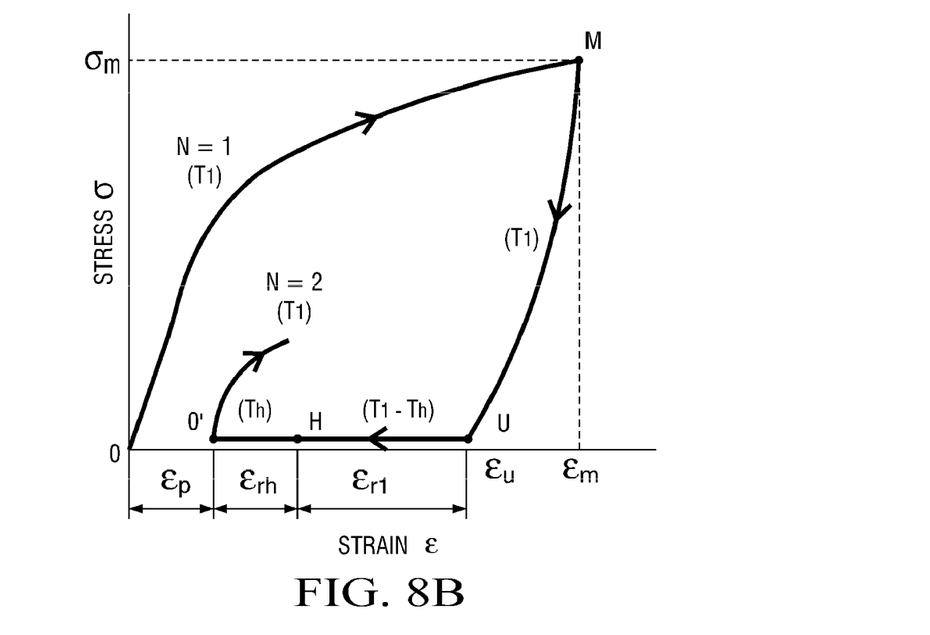
FIG. 8B is a graph depicting the relationship between stress and strain in shape memory polymer below a characteristic setting temperature.

FIGS. 8A and 8B depict the behavior of an SMP at a temperature above Tf (FIG. 8A) and below Ts (FIG. 8B). SMP behavior described above was focused on FIG. 8A. It should be noted that some SMPs also exhibit a stress-induced reduction in the modulus (and hence, stiffness) similar to that described for partially de-twinned martensitic SMA above. Hence, regions in a compliant mechanism made of such an SMP can also exhibit stress-induced/activated de facto hinges/flexible segments.

Activation stimuli other than temperature and stress include UV light for light activated SMPs, pH levels for chemically activated SMPs, etc. More than one activation stimulus may be used concurrently to achieve a desired spatial or temporal change in the material properties.

An open/closed loop controller may be used to coordinate/synchronize the various stimuli in time and/or space to achieve the desired mechanism performance.

As used herein, a "de facto hinge" may include a de facto hinge and/or a flexible segment.

One or more of ideas described in the above exemplary embodiments may be combined. The particular active materials described above may be wholly or partly substituted by materials, composites or systems that are functionally equivalent. The activation signal that produces the desired change in properties of the active materials as described above may be generated in response to a human action, a controller signal triggered by sensed data from one or more sensors, a controller signal triggered by anticipated changes inferred from sensor data, etc.

While the best modes for carrying out the invention have been described in detail, those familiar with the art to which this invention relates will recognize various alternative designs and embodiments for practicing the invention within the scope of the appended claims.

The invention claimed is:
1. A compliant mechanism comprising:
a compliant mechanism body being configured to generate an output in response to an input; said compliant mechanism body having at least one region formed by an active material;

wherein the active material is configured to undergo a change in at least one material property in response to an activation signal;

at least one activation device configured to selectively apply the activation signal to said at least one region;

wherein said at least one activation device includes a plurality of activation devices;

wherein said at least one region includes a plurality of regions; and wherein each of the activation devices is configured to selectively apply an activation signal to a respective one of said plurality of regions.

2. The compliant mechanism of claim 1, further comprising a controller operatively connected to the activation devices and configured to control which of the activation devices applies the activation signal.

3. The compliant mechanism of claim 2, further comprising a sensor configured to monitor a condition and to transmit sensor signals indicative of the condition to the controller; and wherein the controller is configured to determine which of the activation devices applies the activation signal based on the sensor signals.

4. The compliant mechanism of claim 3, wherein said activation signal is characterized by a selectively variable activation signal value;

wherein said at least one material property is characterized by a selectively variable material property value;

wherein the material property value varies with the activation signal value; and wherein the controller is configured to determine the activation signal value applied by the activation devices based on the sensor signals.

5. The compliant mechanism of claim 1, wherein the compliant mechanism body is configured such that the output is characterized by a first performance when the activation signal is applied to said at least one region, and a second performance when the activation signal is not applied to said at least one region.

6. A method comprising:

providing a compliant mechanism body having a first configuration and having at least one region formed by an active material that is configured to undergo a change in at least one material property in response to an activation signal; and applying the activation signal to said at least one region;

wherein said at least one material property includes a modulus;

wherein said applying the activation signal reduces the modulus of said at least one region;

wherein the compliant mechanism body in the first configuration generates a first performance in response to an input in the absence of the activation signal; and determining a desired second performance prior to said applying the activation signal;

while the modulus of said at least one region is reduced, deforming said at least one region such that the compliant mechanism is characterized by a second configuration; and after said deforming said at least one region, raising the modulus of said at least one region while maintaining the compliant mechanism body in the second configuration.

7. The method of claim 6, wherein the compliant mechanism body generates the desired second performance in response to the input in the absence of the activation signal.

8. The method of claim 6, wherein the active material is shape memory polymer characterized by a thermal transition temperature;

wherein said reducing the modulus of said at least one region includes heating the shape memory polymer above the thermal transition temperature; and wherein said raising the modulus of said at least one region includes cooling the shape memory polymer to below the thermal transition temperature.

9. A method comprising:

providing a compliant mechanism body having a first configuration and having at least one region formed by an active material that is configured to undergo a change in at least one material property in response to an activation signal;

applying the activation signal to said at least one region;

wherein said at least one material property includes modulus;

wherein said applying the activation signal reduces the modulus of said at least one region;

wherein the compliant mechanism body in the first configuration generates a first performance in response to an input in the absence of the activation signal; and wherein the method further comprises applying the input to the compliant mechanism body while the modulus of said at least one region is reduced such that the compliant mechanism body generates a second performance different from the first performance.

* * * * *